United States Patent
Ong et al.

[11] Patent Number: 6,077,768
[45] Date of Patent: Jun. 20, 2000

[54] PROCESS FOR FABRICATING A MULTILEVEL INTERCONNECT

[75] Inventors: T. P. Ong; Robert Fiordalice; Ramnath Venkatraman, all of Austin, Tex.

[73] Assignee: Motorola, Inc., Schaumburg, Ill.

[21] Appl. No.: 08/749,316

[22] Filed: Nov. 14, 1996

Related U.S. Application Data

[63] Continuation-in-part of application No. 08/684,069, Jul. 19, 1996.

[51] Int. Cl.$^7$ .................................................. H01L 21/4763
[52] U.S. Cl. ........................... 438/622; 438/628; 438/629; 438/634; 438/644; 438/674; 438/675; 438/677; 438/680
[58] Field of Search .................... 438/622, 674, 438/675, 676, 677, 680, 634, 628, 629

[56] References Cited

U.S. PATENT DOCUMENTS

| | | | |
|---|---|---|---|
| 4,582,563 | 4/1986 | Hazuki et al. | 156/643 |
| 4,710,398 | 12/1987 | Homma et al. | 437/235 |
| 5,227,191 | 7/1993 | Nagashima et al. | 427/97 |
| 5,262,354 | 11/1993 | Cote et al. | 438/645 |
| 5,305,519 | 4/1994 | Yamamoto et al. | 29/852 |
| 5,328,553 | 7/1994 | Poon | 438/633 |
| 5,354,712 | 10/1994 | Ho et al. | 438/643 |
| 5,403,779 | 4/1995 | Joshi et al. | 437/190 |
| 5,654,237 | 8/1997 | Suguro et al. | 438/624 |

FOREIGN PATENT DOCUMENTS 0 211 318 A1 7/1986 European Pat. Off. ........ H01L 21/60

OTHER PUBLICATIONS

Amazawa et al., "A 0.25β m Via Plug Process Using Selective CVD Aluminum for Multilevel Interconnection," IEEE 1991, 10.1.1.—10.1.4., pp. 265–268.

Tsubouchi et al., "Selective AL CVD on Hydrogen–Terminated Si Surface," IEEE 1991, 10.2.1–10.2.4., pp. 269–272.

Matsumiya et al., "Chemical–Vapor Deposition Techniques of Al for Direct Growth on Oxidized Si and High–Speed Growth," Jpn. J. Appl. Phys. vol. 24, 1995, pp. L17–L19.

Wilson et al., "A Comparison of A Two Layer Metal System Built with Selective CVD W Plugs and Elevated Temperature, Sputtered Al(Cu)," IEEE 1989, p. 493.

Zhu et al., "Selective Aluminum CVD for Sub–Micron Via Plug Filling," Mat. Res. Soc. Symp. Proc. vol. 260, 1992, pp. 125–130.

*Primary Examiner*—John F. Niebling
*Assistant Examiner*—Lynne Gurley
*Attorney, Agent, or Firm*—Patricia S. Goddard; Robert A. Rodriguez

[57] ABSTRACT

A process for fabrication of a multilevel interconnect structure includes the formation of an inlaid interconnect (42) overlying an aluminum layer (34). The inlaid interconnect (42) is formed within an interlevel dielectric layer that is processed to contain an interconnect channel (24) and a via opening (14) residing at the bottom of the interconnect channel (24). The aluminum layer (34) is selectively deposited to fill the via opening (14) at the bottom of an interconnect channel (24). Selective deposition is enhanced by the use of a nucleation layer (20) which is formed on the bottom of the via opening, without being formed on the sidewalls, by use of directional deposition technique such as inductively coupled plasma (ICP) deposition. Nucleation layer (20) eases requirements of a cleaning operation prior to selective deposition and provides a surface from which void-free selective growth can occur.

14 Claims, 4 Drawing Sheets

PROCESS FOR FABRICATING A MULTILEVEL INTERCONNECT

REFERENCE TO PRIOR APPLICATION

This application is being filed as a continuation-in-part of a commonly assigned, co-pending application entitled, "Process for Fabricating a Metallized Interconnect," filed as Ser. No. 08/684,069 on Jul. 19, 1996 by Ong et al.

FIELD OF THE INVENTION

This invention relates, in general, to a method for fabricating a semiconductor device, and more particularly, to a method for fabricating a multilevel metallized interconnect having high-aspect-ratio vias.

BACKGROUND OF THE INVENTION

As semiconductor integrated circuits become more complex the feature sizes of individual components are continually being reduced. In addition to feature size reduction, multiple layers of metal interconnects are used to electrically connect the various components of the integrated circuit. The evolution of semiconductor device technology toward smaller features together with the use of multiple metal layers makes the fabrication of state-of-the-art integrated circuits more difficult. Complex fabrication technology is needed to produce electrical interconnect structures having low electrical resistance and continuous electrical pathways.

To accommodate the numerous electrical interconnects which must be formed to an ever increasing number of device components, the contact and via openings formed in interlevel dielectric layers must have a very small diameter. Presently, via openings are fabricated with diameters of one micron or less. While the diameter must be reduced to accommodate the increased number of interconnects, the thickness of the dielectric layer separating the various levels of interconnect layers cannot be decreased without risk of reduced device performance. This has the effect of increasing the aspect ratio of the via openings. The aspect ratio is defined as the depth of the contact opening versus the diameter of the contact opening. In state-of-the-art devices, aspect ratios of 2 to 1, or greater, are commonly encountered. Small diameter openings created in a thick dielectric layer result in the formation of high-aspect-ratio contact openings.

Where the aspect ratios are large it can be difficult to conformally deposit the necessary metal layers needed for the fabrication of a metallized contact structure. Often, when the metal is deposited into a deep contact opening complete, coverage of all contact surfaces is not obtained. Also, poor step coverage is common when multiple layers of metals are used to form an inlaid metal interconnect. Typically, a high-aspect-ratio via is located at the bottom of a channel formed in an interlevel dielectric layer. Metal must uniformly fill both the channel and the underlying via opening.

The formation of an inlaid, aluminum interconnect in which aluminum metal conformally overlies all the surfaces of the highly contoured interconnect openings requires the uniform deposition of aluminum metal on all surfaces of the opening. Conventional physical vapor deposition (PVD) techniques often do not provide adequate step coverage to completely cover the interior surfaces of contact openings. Current techniques used to provide improved metal interconnects and minimize process complexity include a combination of PVD deposited metal and chemical-vapor-deposition (CVD) deposited metal. The combination is advantageous because the PVD deposition process provides a method of depositing a nucleation layer on a dielectric surface. The CVD process is an isotropic deposition process and thus possesses desirable characteristics for the filling of via opening.

Although use of a CVD process improves the step coverage in a high-aspect-ratio via, analysis of very narrow via openings reveals the presence of gaps in metal coverage at the bottom of the via openings. The use of a selectively deposited aluminum to fill the via openings has been proposed to overcome the gap problem but it too has drawbacks. Use of selective aluminum requires a pre-cleaning step to remove a native oxide layer which forms on the underlying metal contact area. In one technique, an argon sputter operation is used to remove this native oxide. However, the process window for the pre-clean is very tight. An insufficient clean leaves islands of the native oxide, which leads to selective aluminum growth having voids. One can compensate for this by over-cleaning, but then the argon ions begin to sputter the underlying metal contact area beneath the native oxide. This sputtered metal tends to then deposit as islands along the sidewalls of the via openings. During the selective aluminum growth, aluminum then nucleates along the sidewalls on the metal islands, in addition to nucleating on the bottom of the via opening, causing trapped voids in the metal plug.

Figure 1:
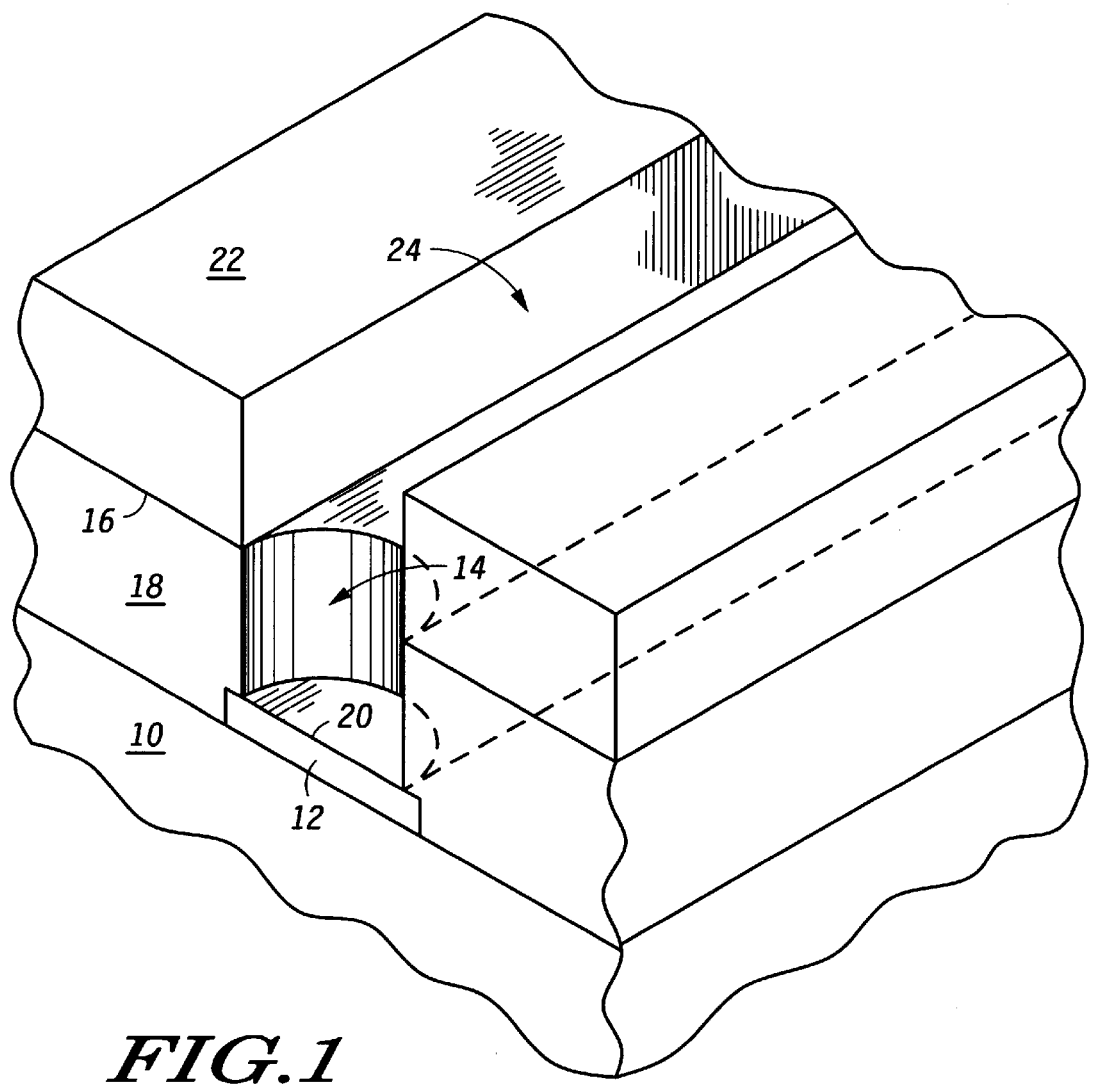
FIG. 1 illustrates, in an isometric view, an interlevel dielectric structure prepared for application of metal to form a multilevel interconnect structure, in accordance with one embodiment of the present invention.

It will be appreciated that for simplicity and clarity of illustration, elements shown in the figures have not necessarily been drawn to scale. For example, the dimensions of some of the elements are exaggerated relative to each other. Further, where considered appropriate, reference numerals have been repeated among the figures to indicate corresponding elements.

DETAILED DESCRIPTION OF PREFERRED EMBODIMENTS

The present invention is for a multilevel interconnect fabrication process and a structure formed thereby, and more particularly, for the fabrication of a metallized via structure used to couple an electrically conductive body to an overlying metal interconnect. The process of the invention specifically addresses the fabrication of a metallized interconnect structure in a high-aspect-ratio via opening within a dielectric layer. For purposes of the description of the invention, a high-aspect-ratio via opening is one in which the diameter of the opening is less than or equal to the depth of the opening. The invention further addresses the fabrication of a metallized via structure in which electrical connection is made between an underlying electrically conductive body and an overlying metal interconnect embedded in a dielectric layer. The fabrication process of the invention utilizes a selected series of processing steps to fabricate a metal structure within a high-aspect-ratio via that provide a uniform metal layer within the via. Additionally, a metallization process carried out in accordance with the invention avoids the formation of gaps or voids within the via opening.

Shown in FIG. 1, in perspective view, is a portion of a semiconductor device having a patterned interlevel dielectric layer (ILD). The ILD layer has been prepared for the formation of an inlaid metal interconnect. The structure illustrates the arrangement of a high-aspect-ratio via opening 14 formed below an interconnect channel 24. To form a reliable interconnect, metal must be uniformly applied to all regions of both via opening 14 and interconnect channel 24. The ILD structure shown in FIG. 1 is intended to generally illustrate a particularly difficult structure for the uniform application of interconnect metal. When the interconnect channel width is about the same as the width of the via opening, uniform deposition into the channel and opening is particularly difficult. However, the present invention is not limited to inlaid structures having similar channel and via opening widths. Instead, the channel width could be larger than the via opening. Furthermore, it should be appreciated the present invention is not limited to an inlaid structure.

Referring to FIG. 1, a portion of a semiconductor substrate 10 is shown having patterned dielectric layers overlying an electrically conductive body 12. Via opening 14 extends from an upper surface 16 of a first dielectric layer 18 to a contact region 20 on the upper surface of electrically conductive body 12. A second dielectric layer 22 overlies first dielectric layer 18. Second dielectric layer 22 contains interconnect channel 24. Interconnect channel 24 exposes via opening 14.

Figure 2:
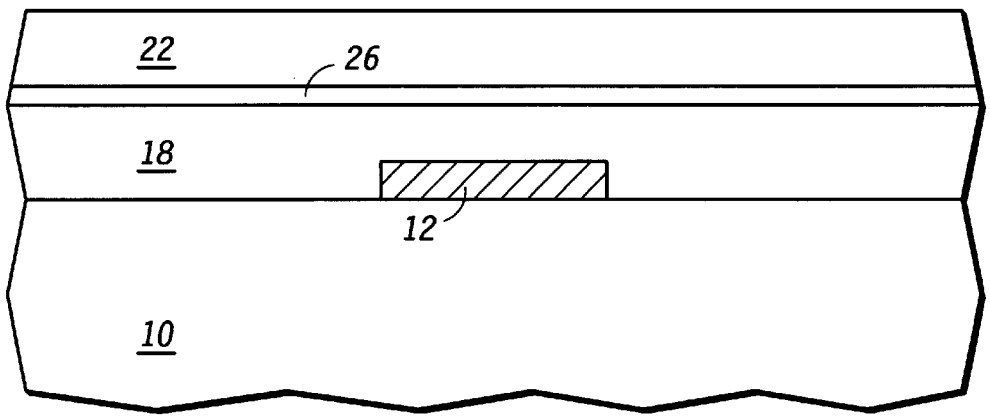
FIGS. 2–7 illustrate, in cross-section, process steps in accordance with one embodiment of the invention.

FIGS. 2–7 illustrate one embodiment of a process for fabricating a high reliability multilevel metallized interconnect structure for the ILD structure illustrated in FIG. 1. A portion of semiconductor substrate 10 having already undergone several process steps in accordance with the invention is shown in FIG. 2. Electrically conductive body 12 overlies the surface of semiconductor substrate 10 and is typically an aluminum interconnect lead overlying the substrate surface. Other interconnect materials, such as copper could be used in place of aluminum. Alternatively, electrically conductive body 12 can be a semiconductor material doped to have high electrical conductivity. For example, electrically conductive body 12 can be a polycrystalline silicon body doped with an N-type or P-type dopant. Additionally, electrically conductive body 12 can be a doped region formed within semiconductor substrate 10 and lying below dielectric layer 18.

First dielectric layer 18 is formed to overlie semiconductor substrate 10 and electrically conductive body 12. First dielectric layer 18 is preferably formed by the chemical vapor deposition (CVD) of silicon dioxide using tetraethylorthosilane (TEOS) source gas. Alternatively, first dielectric layer 18 can be silicon dioxide formed by another technique, such as atmospheric deposition, and the like.

An interface layer 26 is formed to overlie first dielectric layer 18 and separates first dielectric layer 18 from second dielectric layer 22. Interface layer 26 will function as an etch stop layer in the etching process used to form via opening 14 and interconnect channel 24. Preferably, interface layer 26 is a dielectric material that is differentially etchable with respect to both first and second dielectric layers 18 and 22. For example, where first and second dielectric layers 18 and 22 are silicon dioxide, interface layer 26 can be silicon nitride or some other dielectric material capable of resisting an oxide etching process.

Figure 3:
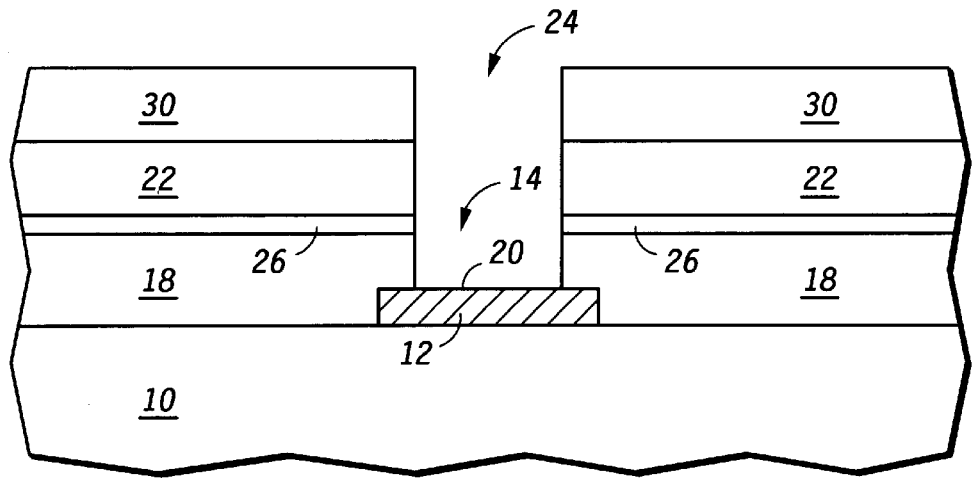

After depositing interface layer 26, second dielectric layer 22 is deposited, again preferably using a CVD oxide deposition using TEOS source gas. After forming the dielectric layers and interface layer on semiconductor substrate 10, an etching process is carried out to form via opening 14 and interconnect channel 24, as illustrated in FIG. 3. There are several known methods for forming such a dual inlaid interconnect and via opening, any one of which can be used to form the structure of FIG. 3. For example, a via opening could be formed first, followed by channel definition. Alternatively, the channel could be formed first, followed by the via opening. In either case, a masking layer 30, such as a photoresist layer, is used to define either of the openings.

In accordance with the invention, after the via opening and interconnect channel have been defined, a pre-clean is done to remove any native oxide layer which may be formed on contact region 20. In a preferred embodiment, the pre-clean is an argon sputtering operation. Ideally, the sputter should remove all of the native oxide layer without sputtering any of the underlying conductive material at contact region 20. However, in practice this is difficult to achieve consistently. In practicing the present invention, the process window of the pre-clean can be widened by allowing an underclean of the native oxide layer without impacting contact resistance of the plug to be formed in the via opening. The lack of impact on contact resistance is further explained below.

Figure 4:
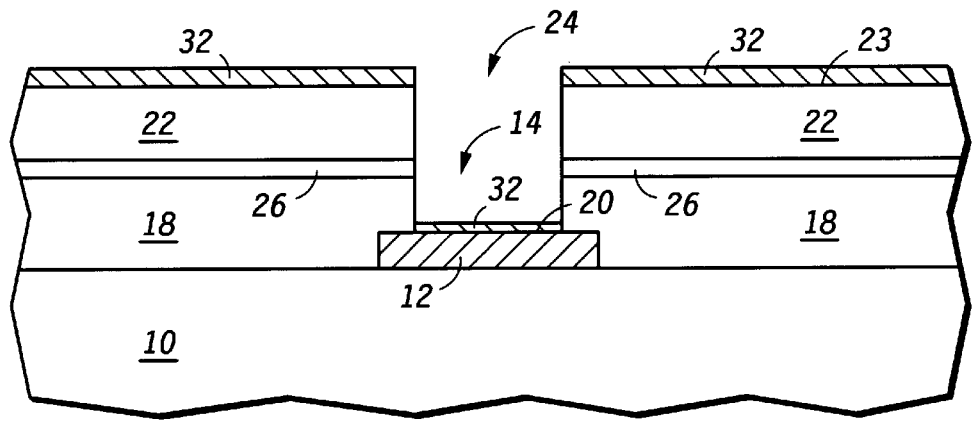

After pre-cleaning, a nucleation layer 32 is deposited over the substrate as illustrated in FIG. 4, without breaking vacuum from the pre-clean operation (i.e. the pre-clean and deposition of nucleation layer 32 are performed in-situ). In the present invention, nucleation layer 32 is formed using a directional physical deposition technique. Preferably, nucleation layer 32 is formed using inductively coupled plasma (ICP) deposition. Another suitable directional deposition technique includes deposition using electron-cyclotron resonance (ECR). Directional deposition is one in which deposition occurs primarily on horizontal surfaces relative to the major surfaces of the substrate, with little or no deposition upon vertical surfaces such as via opening sidewalls. As shown in FIG. 4, nucleation layer 32 is deposited only on the bottom of via opening 14 (i.e. on contact region 20) and on an upper surface 23 of dielectric layer 22. The sidewalls of via opening 14 remain clear. It is noted the nucleation layer 32 will also form on the bottom of interconnect channel 24 (not shown in the view of FIG. 4) in a multilayer interlevel dielectric structure used for inlaid interconnect fabrication.

Another feature of most directional physical deposition techniques is that deposition thickness will be somewhat thicker on upper surface 23 of dielectric layer 22 than on the bottom of via opening 14 on contact region 20. This phenomenon is not a detriment to the present invention because only a thin layer (e.g. 5–20 angstroms) is needed at the bottom of the via opening. It is preferred that the thickness of nucleation layer 32 on top of dielectric layer be kept to below 100 angstroms, simply to avoid risk that the nucleation layer material might deposit on sidewalls of the via opening.

In a preferred embodiment, nucleation layer 32 is a refractory metal, such as titanium, tantalum, or conductive nitrides of titanium or tantalum. Nucleation layer 32 could instead be an aluminum, copper, or other metal layer, provided that the metal is deposited directionally. A benefit of using a refractory metal at the bottom of the via opening is that electromigration resistance is improved, as compared to a plug structure without an intervening refractory metal.

Nucleation layer 32 enables the pre-clean process window to be widened, as mentioned above. If the pre-clean is an under-clean (i.e. not all of the native oxide on contact region 20 is removed), small islands of oxide will remain on the contact region. Normally, these islands create voiding problems when forming a conductive plug by selective deposition because the plug material cannot nucleate on the islands. With the use of a physically deposited nucleation layer 32, any islands of oxide which remain after the pre-clean will be covered by the nucleation layer. Thus, selective growth can be performed uniformly without a degradation of contact resistance.

Figure 5:
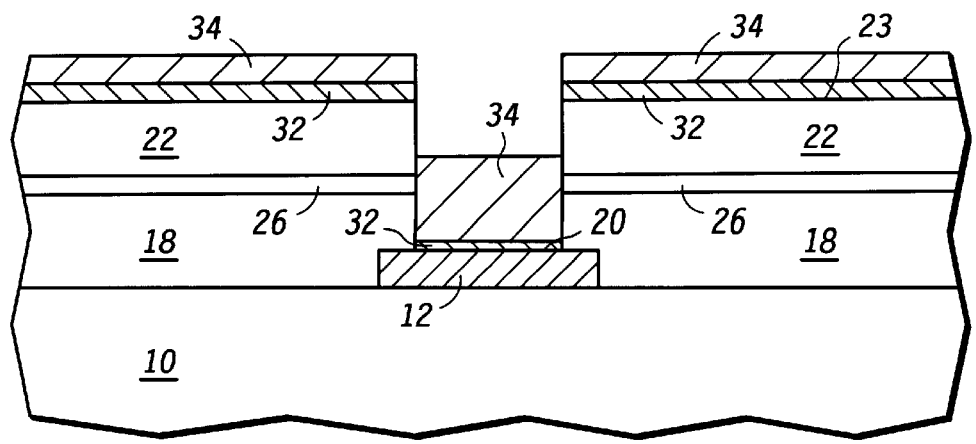

The inventive process continues with the selective deposition of a plug layer 34, as shown in FIG. 5. Plug layer 34 is selectively deposited using chemical vapor deposition (CVD) such that material preferentially nucleates on exposed portions of nucleation layer 32 (i.e. at the bottom via opening 14 over contact region 20, over the upper surface 23 of dielectric layer 22, and on exposed portions of dielectric layer 18 which form the bottom of interconnect channel 24). As the selective deposition process continues, successive layers of the material are deposited over the original nucleation layer, such that a thick region or plug is gradually built up within via opening 14. The selective deposition process is preferably continued until the material fills via opening 14.

In a preferred embodiment, plug layer 34 is deposited as a selective aluminum layer, but selective copper or tungsten can instead be used. For selective aluminum CVD, dimethylaluminumhydride (DMAH) is preferably used as a source gas, delivered by a hydrogen carrier gas. As shown in FIG. 5, it is likely that the selective deposition will occur faster within via opening 14 than over dielectric layer 22. This is actually a benefit in practicing the invention for it reduces the aspect ratio of a subsequent metal deposition (see FIG. 6).

It is important to note that the selective deposition process creates an conductive region within via opening 14 that is free of gaps or voids and fills via opening 14 with a continuous layer of metal. The fabrication of a high reliability interconnect structure requires that via opening 14 contain a continuous, uniform metal layer. By preventing nucleation of the selectively deposited material along sidewalls of the via opening, continuous, void-free growth of a plug material occurs from the bottom of the via opening and proceeds upwards. The process of the invention thus overcomes deficiencies of the prior art by insuring the creation of a uniformly distributed body of metal within the high-aspect-ratio via opening.

Figure 6:
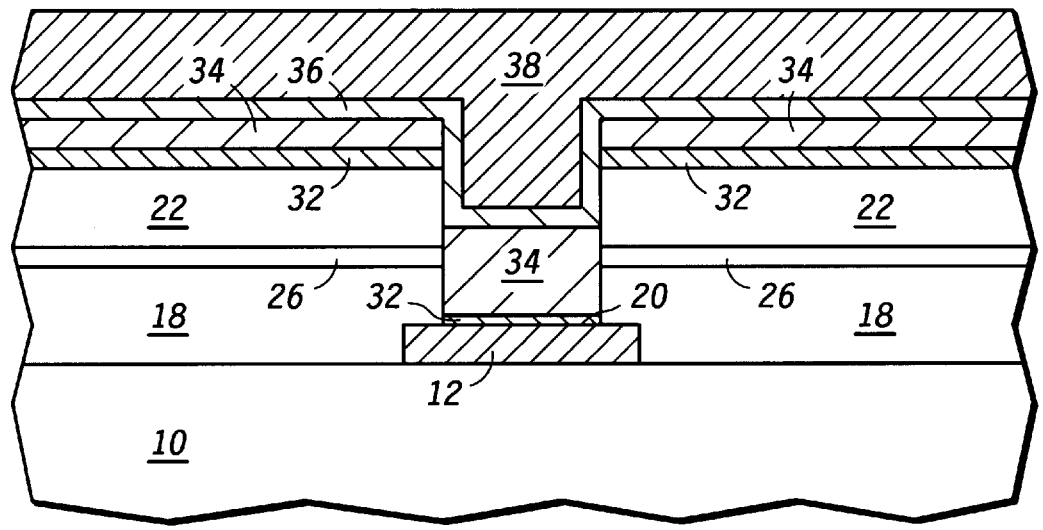

Referring to FIG. 6, after selectively depositing plug layer 34, an adhesion layer 36 is formed to overlie second dielectric layer 22 and the upper surface of plug layer 34. Adhesion layer 36 is conformally deposited, such that a uniformly thick adhesion layer is formed on all surfaces, as shown. Preferably, adhesion layer 36 is a combination of one or more of titanium, aluminum, and titanium nitride. The adhesion layer can be formed by chemical vapor deposition, or by another process, including physical vapor deposition (PVD) processes, such as reactive sputtering. Furthermore, adhesion layer 36 can be tantalum, tantalum nitride, copper, cobalt, and ternary metal alloys such as tantalum silicon nitride, tungsten silicon nitride, and the like. It is noted that adhesion layer 36 is an optional layer, being most useful when the interconnect metallization (as described below) is formed using CVD.

Following the formation of adhesion layer 36, an interconnect metal layer 38 is formed to fill interconnect channel 24 and to overlie the adhesion layer over second dielectric layer 22. Preferably, interconnect metal 38 is a layer of aluminum deposited by CVD, again using DMAH as a source gas and hydrogen as the carrier gas. The chemical vapor deposition process using a metal organic precursor provides an aluminum layer having excellent step coverage over the surface of semiconductor substrate 10. Another suitable material for interconnect metal layer is copper, also deposited by CVD. The chemical vapor deposited interconnect metal completely fills interconnect channel 24 without leaving any voids or gaps at the corners of interconnect channel 24.

During the metal organic chemical vapor deposition process, the aluminum or other metal is deposited in a non-selectively manner due to the uniform coverage of the conductive adhesion layer 36 across the surfaces of the entire substrate. The combination of a selectively deposited metal to fill a high-aspect-ratio via opening, such as via opening 14, in combination with a conformal chemical vapor deposition process to deposit metal in an interconnect channel results in a high reliability metallized interconnect structure. The combination of deposition processes, along with the use of a directionally deposited nucleation layer as used in the present invention, produces uniformly distributed, void-free metal within both via opening 14 and interconnect channel 24. Accordingly, the present invention can be employed to uniformly fill high-aspect-ratio via openings underlying larger openings, such as interconnect channels and other kinds of patterned structures within an interlevel dielectric material.

Figure 7:
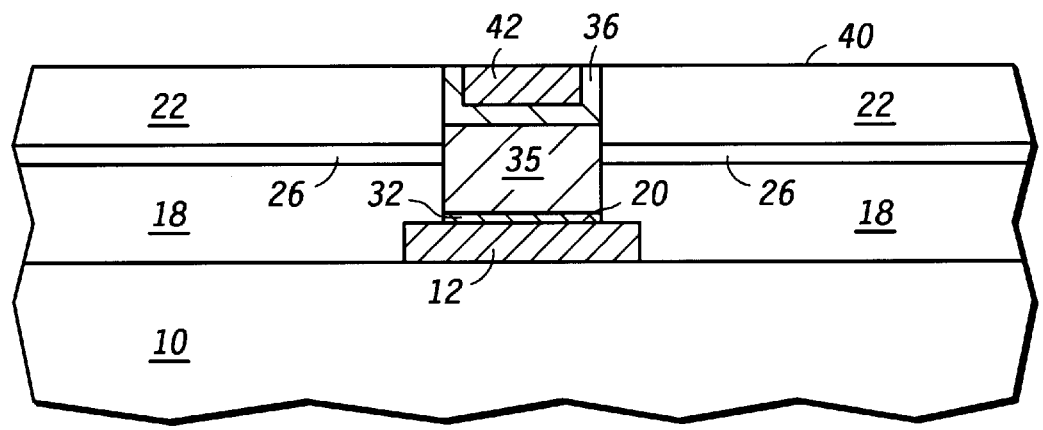

As illustrated in FIG. 7, after forming interconnect metal layer 38, an inlaid metal interconnect 42 is formed by planarizing semiconductor substrate 10 to form a planar surface 40, and to leave the inlaid interconnect 42 in interconnect channel 24. As a result of planarizing, adhesion layer 36 and plug layer 34 beyond via opening 14 and interconnect channel 24 are also removed. Remaining portions of adhesion layer 36 underlie inlaid interconnect 42 and separate inlaid interconnect 42 from a plug 35 formed from plug layer 34. In this manner, a strong adhesive force is provided at all interfaces of inlaid interconnect 42 with underlying metal surfaces.

The planarization process removes portions of interconnect metal layer 38 overlying the upper surface of second dielectric layer 22. Additionally, the planarization process removes portions of adhesion layer 36 overlying the upper surface of second dielectric layer 22. Preferably, a chemical-mechanical-polishing (CMP) process is used to form planar surface 40. In the CMP process, a force is applied to the substrate and an abrasive slurry, dispensed upon a polishing pad, removes layers of material using a combination of chemical and physical mechanisms.

Figure 8:
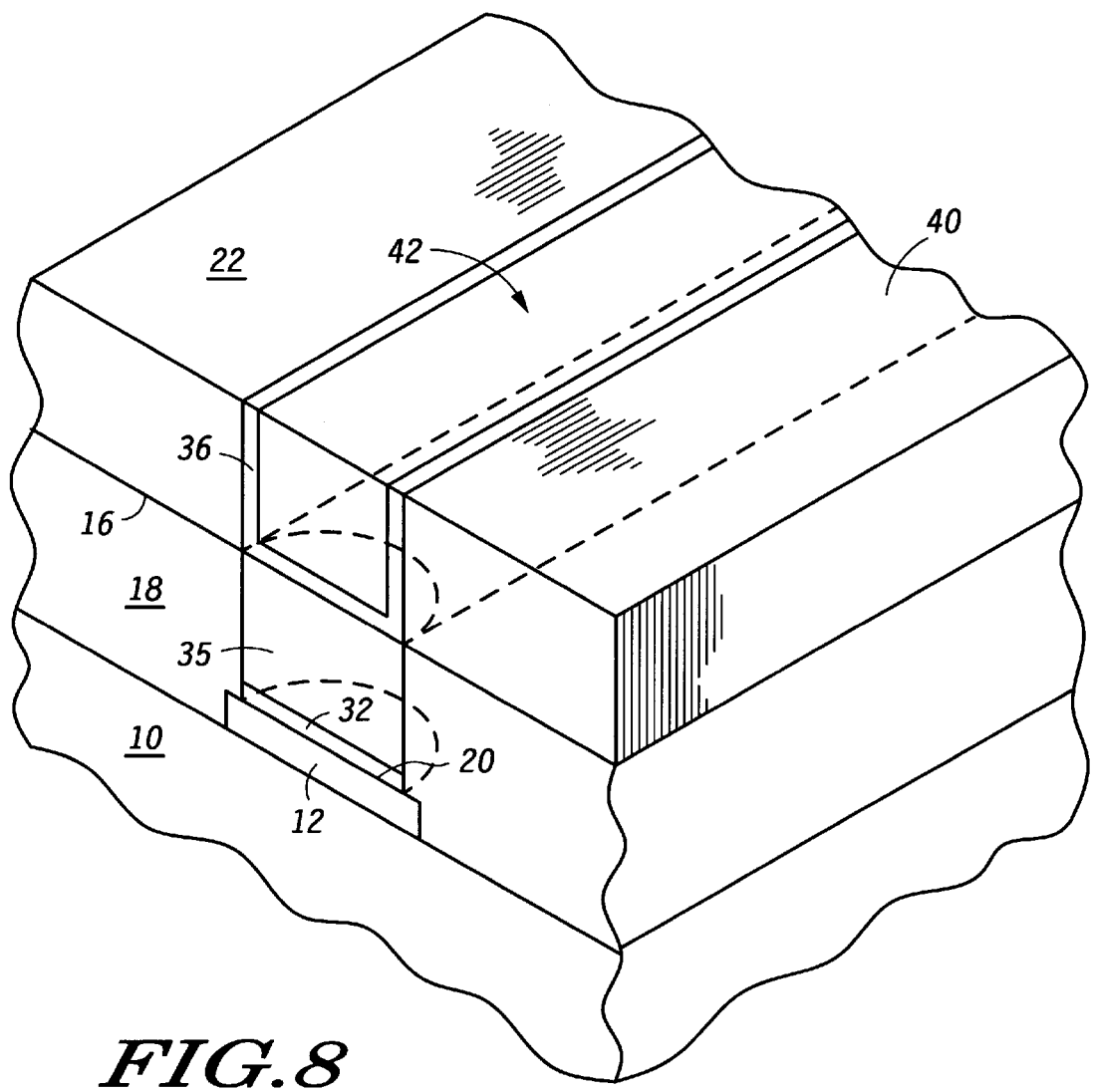
FIG. 8 illustrates, in an isometric view, the interlevel dielectric structure of FIG. 1 after the multilevel interconnect structure has been formed therein in accordance with the process steps of FIGS. 2–7.

FIG. 8 illustrates the device of FIG. 7 in an isometric view. As shown, plug 35 extends through dielectric layer 18 to contact region 20. Interconnect 42 lies above dielectric layer 18, and running through dielectric layer 22 within interconnect channel 24. Adhesion layer 36 lines the interconnect channel and separates the interconnect from the plug. Nucleation layer 32 exists above contact region 20, without being formed on the sidewalls of the via opening. However, it is noted that upon performing selective growth of the plug 34, the nucleation layer 32 may actual combine with the plug material so that a distinct separation between the two layers is not visible.

Although the process of the invention has been illustrated through the fabrication of an inlaid interconnect structure, those skilled in the art will recognize that the process of the invention can be applied to other structural arrangements.

For example, rather than an interconnect channel, the opening formed in second dielectric layer 22 can be of similar dimensions as via opening 14 to create a stacked via. Additionally, rather than a multilayered interlevel dielectric structure, the dielectric material can be a single, continuous region of dielectric material with a single opening penetrating the dielectric material. The selective plug layer is grown to fill the single opening, and CMP is performed to planarize the substrate, leaving conductive material only in the opening. Metal interconnect can then be formed by a blanket metal deposition, followed by patterning and etch. Or, a second dielectric layer can be deposited and an opening formed therein to expose the selectively grown plug. The metal interconnect material is then blanketly deposited and either polished backed or etched to form the interconnect.

Thus it is apparent that there has been provided, in accordance with the invention, a process for fabricating a multilevel metallized interconnect structure in a semiconductor device, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, different metal interconnect alloys can be used, such as aluminum copper, aluminum silicon aluminum silicon copper, copper alloys, and the like. It is therefore intended to include within the invention all such variations and modifications as fall within the scope of the appended claims and equivalents thereof.

What is claimed is:

1. A method for forming a multilevel interconnect, comprising the steps of:

providing a substrate having a conductive structure;

forming a first dielectric layer over a major surface of the substrate and the conductive structure;

removing a portion of the first dielectric layer to form a via, the via exposing a portion of the conductive structure;

depositing a nucleation layer on the portion of the conductive structure using a directional metal deposition technique selected from the group consisting of an inductive coupled plasma deposition process and an electron cyclotron resonant plasma deposition process to minimize a deposition of the nucleation layer on a sidewall of the via; and selectively chemically vapor depositing a first metal layer on the nucleation layer to substantially fill the via.

2. The method of claim 1, further comprising the steps of:

forming a second dielectric layer over the first dielectric layer;

patterning the second dielectric layer to form a channel in the second dielectric layer, a portion of the channel overlying the portion of the conductive structure; and forming a second metal layer over the first metal layer and substantially filling the channel.

3. The method of claim 2, further comprising the steps of:

forming an interface layer between the first dielectric layer and the second dielectric layer; and patterning the interface layer to form an opening prior to the step of removing the portion of the first dielectric layer, the opening overlying the portion of the first dielectric layer.

4. The method of claim 3, wherein:

the step of forming a first dielectric layer includes forming a first oxide layer;

the step of forming a second dielectric layer includes forming a second oxide layer; and the step of forming an interface layer includes forming a nitride layer.

5. The method of claim 2, wherein the step of forming a second metal layer includes forming the second metal layer on the first metal layer using a physical vapor deposition process.

6. The method of claim 2, further comprising the step of forming an adhesion layer, the adhesion layer being between the first metal layer and the second metal layer and between a sidewall of the channel and the second metal layer.

7. The method of claim 6, wherein:

the step of forming an adhesion layer includes forming the adhesion layer via a sputtering process; and the step of forming a second metal layer includes forming the second metal via a chemical vapor deposition process.

8. A method for forming a multilevel interconnect, comprising the steps of:

providing a substrate having a major surface;

forming a conductive structure adjacent the major surface;

forming a first dielectric layer over the major surface of the substrate and the conductive structure;

forming an interface layer on the first dielectric layer;

forming a second dielectric layer on the interface layer;

patterning the second dielectric layer to form a channel in the second dielectric layer;

patterning a portion of the interface layer exposed by the channel in the second dielectric layer to form an opening;

patterning a portion of the first dielectric layer exposed by the opening in the interface layer to form a via in the first dielectric layer, the via exposing a portion of the conductive structure;

depositing a nucleation layer on the portion of the conductive structure using a directional metal deposition technique selected from the group consisting of an inductive coupled plasma deposition process and an electron cyclation resonant plasma deposition process to minimize a deposition of the nucleation layer on a sidewall of the via, a sidewall of the opening, and a sidewall of the channel;

selectively chemically vapor depositing a first metal layer on the nucleation layer to substantially fill the via; and forming a second metal layer over the first metal layer and substantially filling the channel.

9. The method of claim 8, wherein:

the step of forming second metal layer includes forming the second metal layer using a process selected from the group consisting of a physical vapor deposition and a chemical vapor deposition process.

10. The method of claim 8, wherein the step of depositing a nucleation layer includes forming the nucleation layer having a thickness ranging from approximately five angstrom to approximately twenty angstrom.

11. The method of claim 8, further comprising the step of forming an adhesion layer between the first metal layer and the second metal layer overlying the via and between a bottom of the channel and the second metal layer elsewhere.

12. The method of claim 11, wherein:

the step of forming an adhesion layer includes forming the adhesion layer via a sputtering process; and the step of forming a second metal layer includes forming the second metal on the adhesion layer via a chemical vapor deposition process.

13. A method for forming a multilevel interconnect, comprising the steps of:

providing a substrate having a conductive structure;

forming a first dielectric layer over a major surface of the substrate and the conductive structure;

removing a portion of the first dielectric layer to form a via, the via exposing a portion of the conductive structure;

depositing a nucleation layer on the portion of the conductive structure using a directional metal deposition technique selected from the group consisting of an inductive coupled plasma deposition process and an electron cyclotron resonant plasma deposition process without depositing the nucleation layer on a sidewall of the via; and selectively chemically vapor depositing a first metal layer on the nucleation layer to substantially fill the via.

14. The method of claim 13, wherein:

the step of depositing a nucleation layer includes depositing the nucleation layer having a thickness ranging from approximately five angstroms to approximately twenty angstroms.

* * * * *